United States Patent
Nakanishi et al.

(12) 
(10) Patent No.: US 10,244,668 B2
(45) Date of Patent: Mar. 26, 2019

(54) HEAT DISSIPATING STRUCTURE AND ELECTRONIC APPARATUS

(71) Applicant: Panasonic Intellectual Property Management Co., Ltd., Osaka (JP)

(72) Inventors: Yoshihide Nakanishi, Osaka (JP); Norihiro Yahata, Osaka (JP); Hisashi Serita, Osaka (JP); Masaya Koshimuta, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/745,730

(22) PCT Filed: Jul. 28, 2016

(86) PCT No.: PCT/JP2016/003498
§ 371 (c)(1),
(2) Date: Jan. 18, 2018

(87) PCT Pub. No.: WO2017/022221
PCT Pub. Date: Feb. 9, 2017

(65) Prior Publication Data
US 2018/0199472 A1 Jul. 12, 2018

(30) Foreign Application Priority Data

Aug. 5, 2015 (JP) .................. 2015-155419

(51) Int. Cl.
*H05K 7/20* (2006.01)
*H01L 23/00* (2006.01)
(Continued)

(52) U.S. Cl.
CPC ......... *H05K 7/20963* (2013.01); *H01L 23/00* (2013.01); *H01L 23/3677* (2013.01);
(Continued)

(58) Field of Classification Search
CPC .......... H05K 7/20454; H05K 7/20463; H05K 7/20471–7/20472; H05K 7/0481;
(Continued)

(56) References Cited

U.S. PATENT DOCUMENTS 5,608,610 A * 3/1997 Brzezinski .......... H01L 23/3675
257/713
5,814,535 A * 9/1998 Shimada ............... H01L 21/486
257/E23.055
(Continued)

FOREIGN PATENT DOCUMENTS

JP 2001-326492 11/2001
JP 2002-158317 5/2002
(Continued)

OTHER PUBLICATIONS

International Search Report of PCT application No. PCT/JP2016/003498 dated Oct. 4, 2016.
(Continued)

*Primary Examiner* — Dion Ferguson
*Assistant Examiner* — Amir A Jalali
(74) *Attorney, Agent, or Firm* — McDermott Will & Emery LLP

(57) ABSTRACT

A heat radiation structure includes a heat spreader provided on a heating component mounted on a substrate, a heat sink disposed at a position facing the heat spreader, a heat transfer member disposed between the heat spreader and the heat sink, and transmitting heat from the heat spreader to the heat sink, and a conductive member electrically connecting the heat spreader and the heat sink.

8 Claims, 9 Drawing Sheets

(51) Int. Cl.
*H01L 23/42* (2006.01)
*H01L 23/433* (2006.01)
*H01L 23/552* (2006.01)
*H05K 7/14* (2006.01)
*H05K 9/00* (2006.01)
*H01L 23/367* (2006.01)
*H01L 23/40* (2006.01)

(52) U.S. Cl.
CPC ......... *H01L 23/42* (2013.01); *H01L 23/4334* (2013.01); *H01L 23/552* (2013.01); *H05K 7/142* (2013.01); *H05K 7/20163* (2013.01); *H05K 7/20445* (2013.01); *H05K 9/00* (2013.01); *H05K 9/0054* (2013.01); *H01J 2217/492* (2013.01); *H01L 23/4006* (2013.01); *H01L 2023/4056* (2013.01); *H01L 2023/4068* (2013.01)

(58) Field of Classification Search
CPC ...... H05K 1/0201–1/0204; H05K 9/00; H05K 9/0054; H05K 9/0024–9/0028; H05K 2201/10371; H01L 23/00; H01L 23/3677; H01L 23/42; H01L 23/4334; H01L 23/552; H01L 23/4006; H01L 23/4056; H01L 23/4068
USPC ........ 361/704, 709–710, 711, 714, 717–719, 361/720, 679.54, 800, 816, 818; 165/80.1–80.2, 185; 257/706, 718–719; 174/252, 547–548
See application file for complete search history.

(56) References Cited

U.S. PATENT DOCUMENTS

| | | | |
|---|---|---|---|
| 6,933,602 | B1 | 8/2005 | Patel et al. |
| 8,259,281 | B2* | 9/2012 | Takahashi ............ G02B 6/0031 349/161 |
| 9,059,127 | B1 | 6/2015 | Lamorey et al. |
| 2002/0079593 | A1 | 6/2002 | Huang |
| 2002/0174998 | A1* | 11/2002 | Takaoka ............. H05K 7/20963 174/68.1 |
| 2005/0280142 | A1* | 12/2005 | Hua ........................ H01L 23/10 257/707 |
| 2007/0231953 | A1* | 10/2007 | Tomita ................ H01L 21/4867 438/106 |
| 2011/0242764 | A1* | 10/2011 | Hill ........................ G06F 1/203 361/705 |
| 2013/0147028 | A1* | 6/2013 | Su ........................... H01L 21/50 257/712 |
| 2014/0015106 | A1* | 1/2014 | Hsieh .................... H01L 23/562 257/618 |
| 2014/0374901 | A1* | 12/2014 | Huishu ................... H01L 23/60 257/737 |

FOREIGN PATENT DOCUMENTS

| | | |
|---|---|---|
| JP | 2002-351346 | 12/2002 |
| JP | 2012-146778 | 8/2012 |
| JP | 2012227229 A * | 11/2012 |

OTHER PUBLICATIONS

The Extended European Search Report dated Jul. 17, 2018 for the related European Patent Application No. 16832504.1.

* cited by examiner

HEAT DISSIPATING STRUCTURE AND ELECTRONIC APPARATUS

This application is a U.S. national stage application of the PCT International Application No. PCT/JP2016/003498 filed on Jul. 28, 2016, which claims the benefit of foreign priority of Japanese patent application No. 2015-155419 filed on Aug. 5, 2015, the contents all of which are incorporated herein by reference.

TECHNICAL FIELD

The present disclosure relates to a heat radiation structure for radiating heat emitted from a heating component, and to an electronic device.

BACKGROUND ART

An electronic device such as liquid crystal television receiver is mounted with, for example, a heating component such as a large scale integration (LSI). In recently prevailing electronic devices having higher functionality, operating frequencies of heating components have been rising, and thus heating values of the heating components have been increasing.

PTL 1 discloses a heat radiation structure for radiating heat emitted from a heating component. The heat radiation structure is attached with, on a front face of the heating component, a heat sink via a heat transfer member. Therefore, heat emitted from the heating component is transmitted to the heat sink via the heat transfer member and radiates through the heat sink.

On the other hand, in an electronic device described above, the heating component radiates electromagnetic waves (noises) referred to as electromagnetic interference (EMI), which might affect other electronic devices. As a measure against EMI, an electromagnetic wave absorption sheet for absorbing electromagnetic waves radiated from a heating component is in some cases applied onto a back face of a heat sink.

CITATION LIST

Patent Literature

PTL 1: Unexamined Japanese Patent Publication No. 2002-158317

SUMMARY

The present disclosure provides a heat radiation structure capable of reducing electromagnetic waves to be radiated from a heating component, and an electronic device including the heat radiation structure.

The heat radiation structure of the present disclosure includes a heat spreader provided on a heating component mounted on a substrate, a heat sink disposed at a position facing the heat spreader, a heat transfer member disposed between the heat spreader and the heat sink, and transmitting heat from the heat spreader to the heat sink, and a conductive member electrically connecting the heat spreader and the heat sink.

The electronic device of the present disclosure includes a substrate, a heating component mounted on the substrate and including a heat spreader, a heat sink disposed at a position facing the heat spreader, a heat transfer member disposed between the heat spreader and the heat sink, and transmitting heat from the heat spreader to the heat sink, and a conductive member electrically connecting the heat spreader and the heat sink.

The heat radiation structure of the present disclosure is capable of reducing electromagnetic waves to be radiated from the heating component.

DESCRIPTION OF EMBODIMENTS

Knowledge Underlying the Present Disclosure

Figure 1:
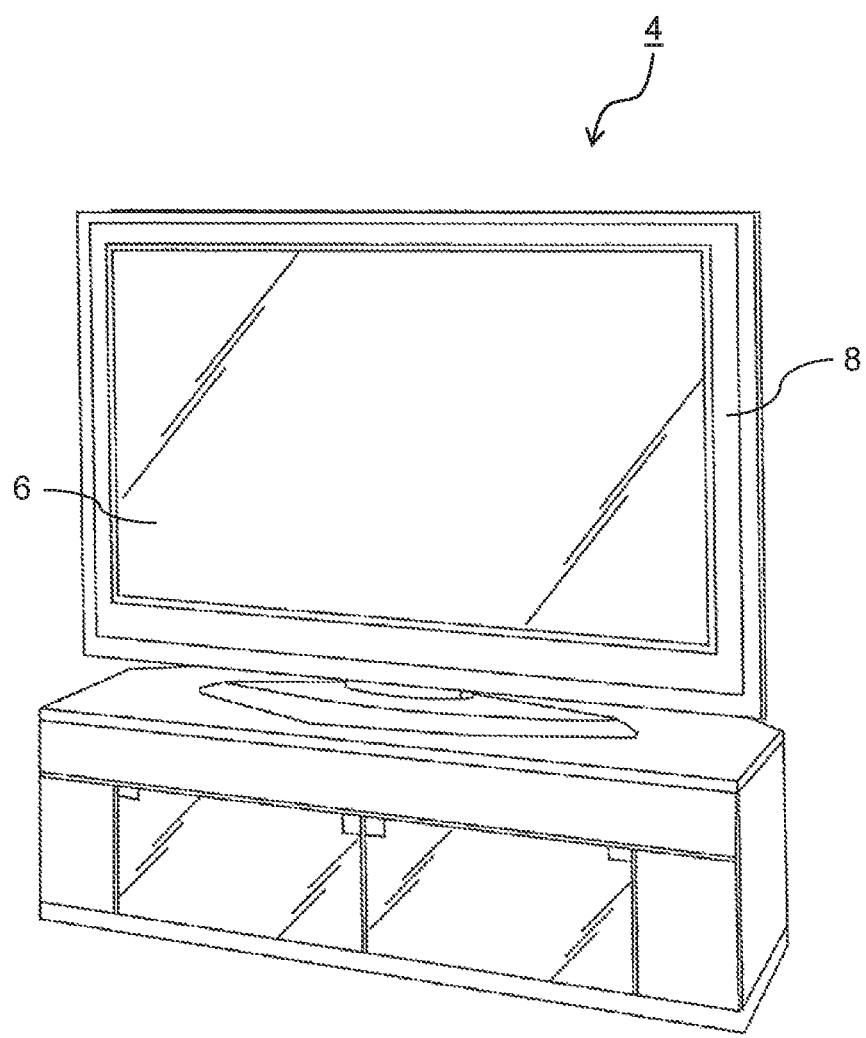
FIG. 1 is an external view illustrating an example of an electronic device mounted with a heat radiation structure according to a first exemplary embodiment.

The inventors of the present application have identified problems described below with respect to the technique disclosed in PTL 1.

PTL 1 discloses the heat radiation structure in which the heat sink made of metal is attached, via the heat transfer member, onto a front face of a resin package configuring the heating component (e.g., semiconductor integrated circuit).

On the other hand, as a measure against EMI, a method for applying an electromagnetic wave absorption sheet onto a back face of a heat sink is known. However, when this measure against EMI is used, components of the heat radiation structure increases in number.

PTL 1 discloses the heat radiation structure in which the heat sink and a ground (GND) terminal of the heating component are electrically connected with a conductor layer, as a measure against EMI. Therefore, electromagnetic waves to be radiated from the heating component can be re duce d.

However, in the heat radiation structure implemented with the measure against EMI, which is disclosed in PTL 1, when the heat sink is greater in size than a ¼ wavelength of a frequency of an electromagnetic wave to be radiated from the heating component, the heat sink might act as an antenna, and electromagnetic waves might be radiated from the heat sink. As a result, there is a case where the measure against EMI, which is disclosed in PTL 1, cannot sufficiently reduce electromagnetic waves to be radiated from the heating component.

In addition, in recent years, there is a case where a metallic heat spreader is used for a heating component in order to effectively radiate heat emitted from the heating component. However, when a heat sink is attached to this heat spreader via a heat transfer member, the heat sink and the heat spreader form a capacitive coupling through the heat transfer member, and thus radiation amount of electromagnetic waves might be increased. As a result, the measure against EMI, which is disclosed in PTL 1, might not sufficiently reduce electromagnetic waves to be radiated from the heating component.

Hereinafter, exemplary embodiments will be described in detail with reference to the drawings appropriately. However, descriptions in more detail than necessary may be omitted. For example, a detailed description of a matter which is already well-known, and an overlapped description for a substantially identical configuration may be omitted. This is intended to prevent the following description from becoming unnecessarily redundant and to facilitate understanding by those skilled in the art.

Note that the attached drawings and the following description are provided for those skilled in the art to sufficiently understand the present disclosure, and are not intended to limit the subject matter as described in the appended claims.

The drawings are also schematic views, and are not always exactly illustrated. In the respective drawings, substantially identical components are denoted by identical numerals or symbols, and their descriptions may be omitted or simplified as appropriate.

First Exemplary Embodiment

A first exemplary embodiment will be described hereinafter with reference to FIGS. 1 to 5B.

[1-1. Overall Configuration of Heat Radiation Structure]

First, an overall configuration of heat radiation structure 2 according to the first exemplary embodiment will be described hereinafter with reference to FIGS. 1 to 5B.

FIG. 1 is an external view illustrating an example of electronic device 4 mounted with heat radiation structure 2 according to the first exemplary embodiment.

Figure 2:
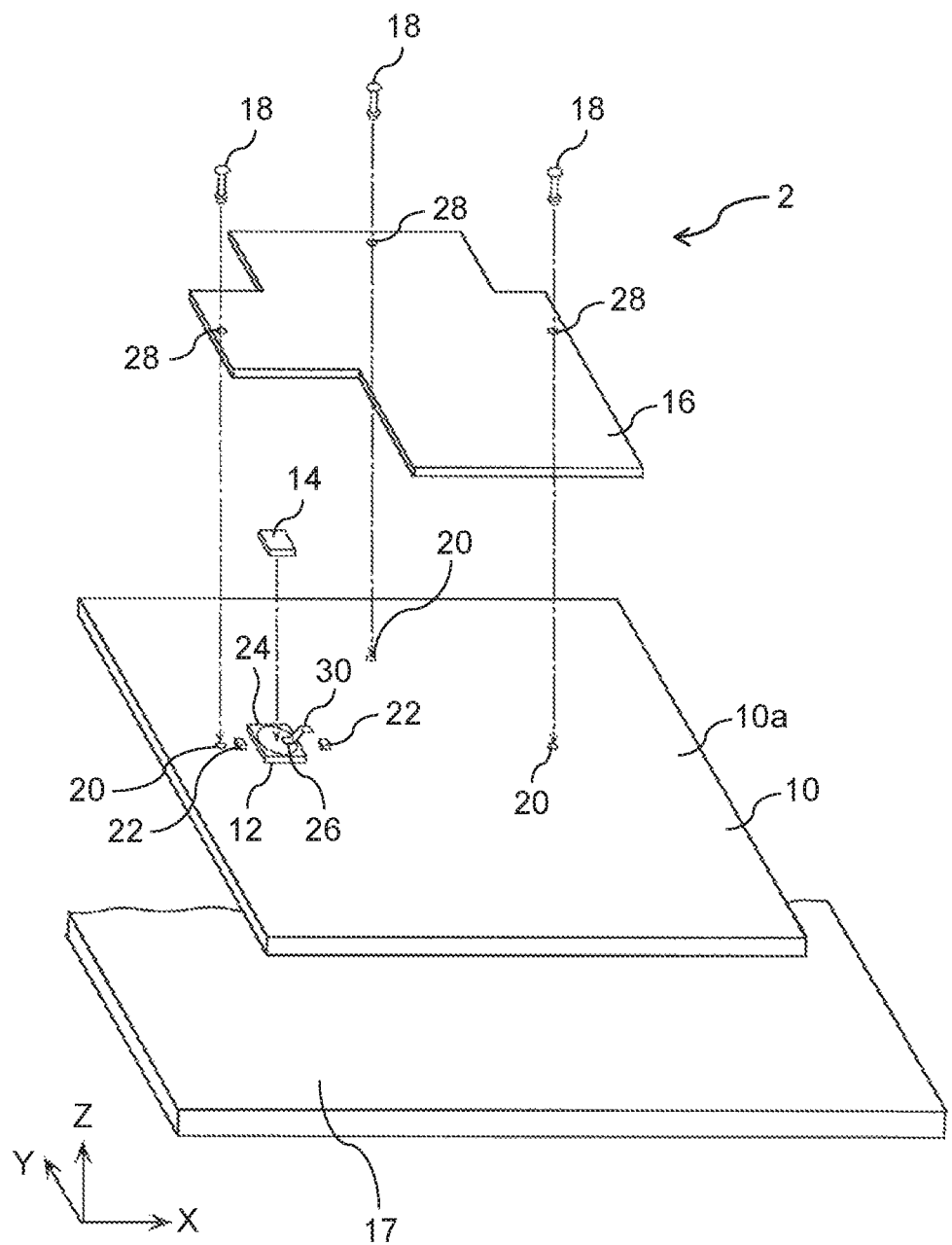
FIG. 2 is an exploded perspective view schematically illustrating an example of the heat radiation structure according to the first exemplary embodiment.

FIG. 2 is an exploded perspective view schematically illustrating an example of heat radiation structure 2 according to the first exemplary embodiment.

Figure 3:
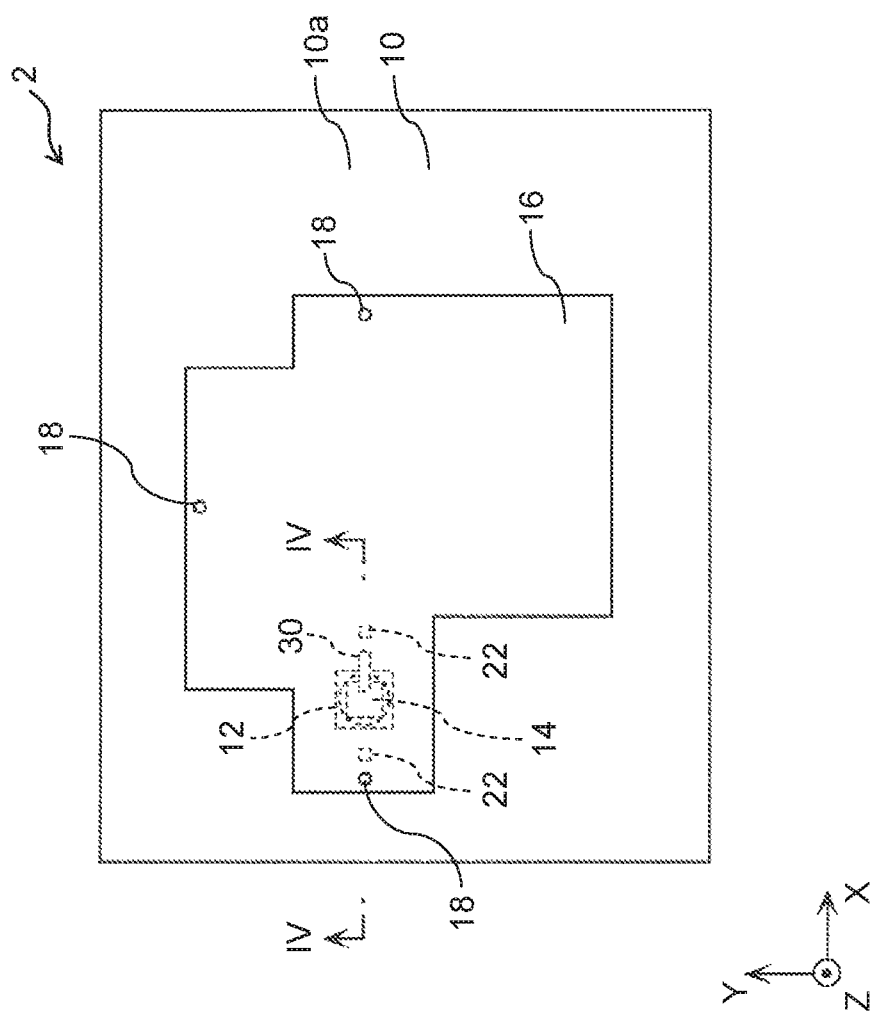
FIG. 3 is a plan view schematically illustrating the example of the heat radiation structure according to the first exemplary embodiment.

FIG. 3 is a plan view schematically illustrating the example of heat radiation structure 2 according to the first exemplary embodiment.

Figure 4:
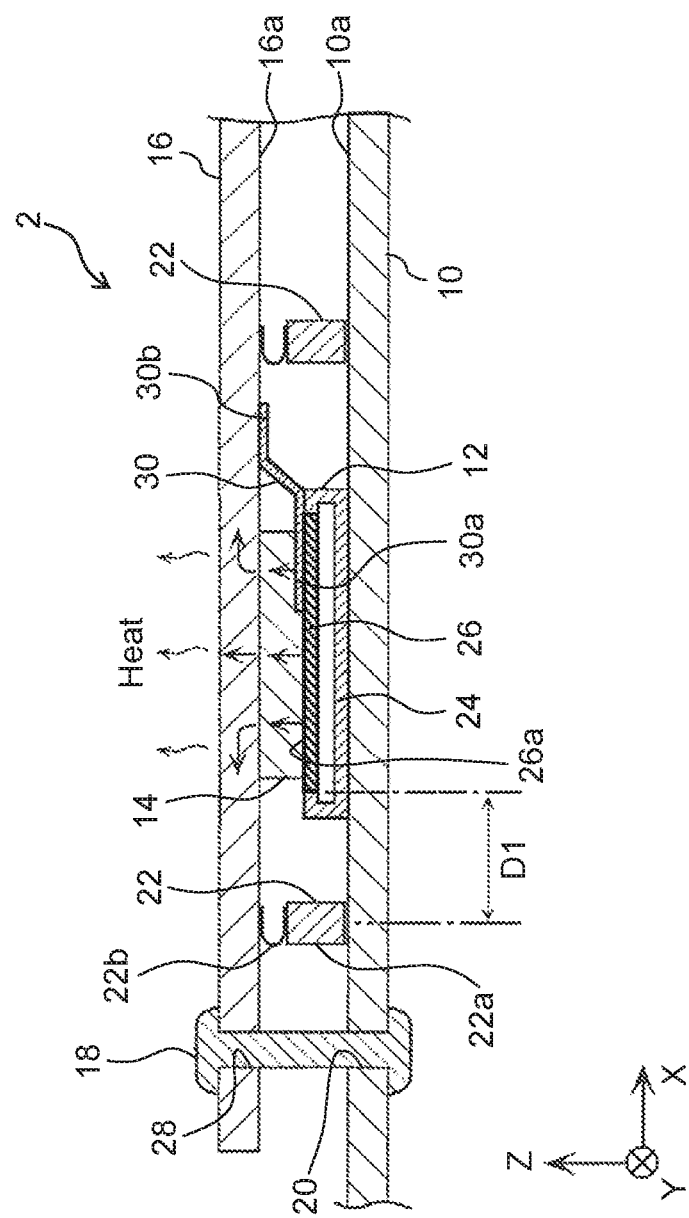
FIG. 4 is a cross-sectional view schematically illustrating the example of the heat radiation structure according to the first exemplary embodiment.

FIG. 4 is a cross-sectional view schematically illustrating the example of heat radiation structure 2 according to the first exemplary embodiment. FIG. 4 illustrates the cross-sectional view of heat radiation structure 2 illustrated in FIG. 3, which is taken along line IV-IV.

Figure 5A:
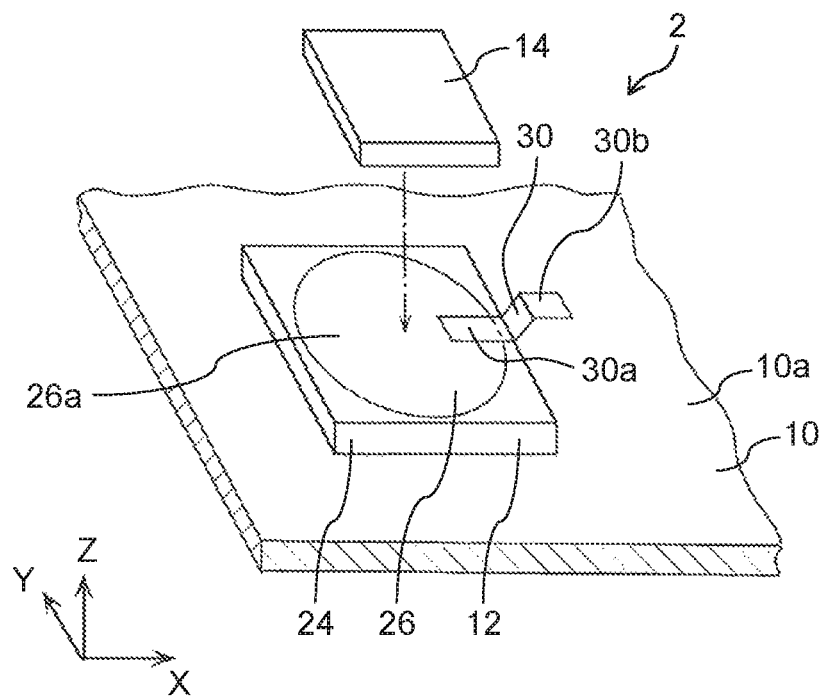
FIG. 5A is a perspective view schematically illustrating an example of a state where a heat transfer member is removed from a heating component, in the heat radiation structure according to the first exemplary embodiment.
Figure 5B:
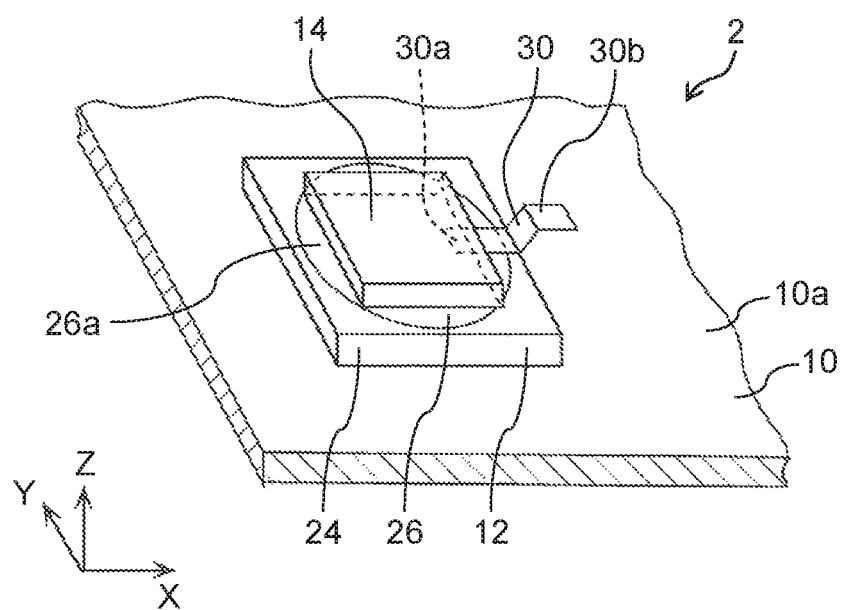
FIG. 5B is a perspective view schematically illustrating an example of a state where the heat transfer member is attached to the heating component, in the heat radiation structure according to the first exemplary embodiment.

FIG. 5A is a perspective view schematically illustrating an example of a state where heat transfer member 14 is removed from heating component 12, in heat radiation structure 2 according to the first exemplary embodiment. FIG. 5B is a perspective view schematically illustrating an example of a state where heat transfer member 14 is attached to heating component 12, in heat radiation structure 2 according to the first exemplary embodiment.

In each of the drawings in and after FIG. 2, three axes, i.e., axes X, Y, and Z, are illustrated for facilitating visual understanding. However, these axes are merely intended for convenience, and are not intended to limit whatsoever the present disclosure.

Electronic device 4 illustrated in FIG. 1 is, for example, a liquid crystal television receiver. Electronic device 4 includes housing 8 covering liquid crystal panel unit 6. Inside housing 8, heat radiation structure 2 as illustrated in FIGS. 2 to 5B is disposed.

Electronic device 4 is not limited to a liquid crystal television receiver whatsoever. Electronic device 4 may be another electronic device such as a video recorder, a computer, or a portable terminal.

Heat radiation structure 2 according to the first exemplary embodiment includes substrate 10, heating component 12, heat transfer member 14, and heat sink 16. Heat radiation structure 2 is a structure for radiating heat emitted from heating component 12.

As illustrated in FIG. 2, substrate 10 is attached, with a plurality of screws (not illustrated), to chassis 17 for supporting liquid crystal panel unit 6. Chassis 17 is made of, for example, a metallic material such as steel electrolytic cold commercial (SECC: zinc coated steel sheet). To simplify description, chassis 17 is omitted in FIGS. 3 to 5B.

Front face 10a of substrate 10 is formed with printed wiring (not illustrated) such as ground (reference potential or ground potential: GND) wiring. Front face 10a of substrate 10 is also mounted with a plurality of electronic components (not illustrated) such as a large-scale integration (an LSI), an integrated circuit (IC), capacitors, and resistive elements. As illustrated in FIG. 2, substrate 10 is formed with a plurality of through holes 20 for allowing clampers 18 (described later) to pass through.

As illustrated in FIGS. 2 and 3, front face 10a of substrate 10 is also mounted with a plurality of on-board contacts 22 having conductivity. As illustrated in FIG. 4, end portion 22a of each of on-board contacts 22 is fixed to a ground terminal (a terminal having a ground potential: not illustrated) formed on front face 10a of substrate 10 through a conductive bonding member such as solder. Therefore, the ground terminal of substrate 10 and each of on-board contacts 22 are electrically connected to each other, and thus a potential of each of on-board contacts 22 is substantially identical to the ground potential.

Other end portion 22b of each of on-board contacts 22 is formed to be elastically deformable in a thickness direction (Z-axis direction) of substrate 10, and is closely fitted to back face 16a of heat sink 16 (a side facing substrate 10). Therefore, heat sink 16 and each of on-board contacts 22 are electrically connected to each other.

As described above, heat sink 16 and the ground terminal of substrate 10 are electrically connected to each other via the plurality of on-board contacts 22, and thus the potential of heat sink 16 is substantially identical to the ground potential. A gasket may be attached to front face 10a of substrate 10, instead of on-board contacts 22.

Heating component 12 is an electronic component that heats when power is supplied, among the plurality of electronic components mounted on front face 10a of substrate 10. Heating component 12 may be constituted by a semiconductor integrated circuit (LSI) operating at a higher frequency of approximately 1 GHz, for example.

As illustrated in FIGS. 4 and 5A, heating component 12 includes package 24 that is made of resin and that covers a semiconductor chip (not illustrated), and heat spreader 26 exposed on a top face of package 24. Heat spreader 26 is a plate that has an approximately circular shape, that radiates heat generated in the semiconductor chip, and that is made of a metallic material having relatively higher thermal conductivity, such as aluminum. Package 24 and heat spreader 26 are integrally formed. In other words, heat spreader 26 is integrally formed with heating component 12.

On-board contacts 22 described above are disposed so that arrangement gap D1 between each of on-board contacts 22 and heat spreader 26 (see FIG. 4) is smaller than a ¼ wavelength (e.g., approximately 15 cm) of a frequency of an electromagnetic wave to be radiated from heating component 12. Arrangement gap D1 represents, as illustrated in FIG. 4, a distance between one end portion of heat spreader 26, which lies closest to one of on-board contacts 22, and a center (central axis) of the one of on-board contacts 22. Therefore, unnecessary electromagnetic waves (unnecessary energy in an electromagnetic field) to be radiated from heat sink 16 can be reduced.

Heat transfer member 14 is a member for transmitting heat emitted from heat spreader 26 of heating component 12 to heat sink 16. Heat transfer member 14 is made of a non-conductive material such as silicone rubber. Heat transfer member 14 has, for example, a thickness of approximately several mm (e.g., in a range from 1 mm to 5 mm inclusive) in the Z-axis direction. As illustrated in FIGS. 4 to 5B, heat transfer member 14 is disposed so as to be pinched between heat sink 16 and heat spreader 26. In other words, heat transfer member 14 is disposed so as to contact each of back face 16a of heat sink 16 and front face 26a of heat spreader 26 (a face exposed from heating component 12). Heat transfer member 14 is disposed to almost wholly cover front face 26a of heat spreader 26.

Heat sink 16 is a heat sink for radiating heat generated in the semiconductor chip of heating component 12 and emitted from heat spreader 26. Heat sink 16 is made of a metallic material having relatively higher thermal conductivity, such as aluminum. Heat sink 16 is disposed at a position facing front face 26a of heat spreader 26. As illustrated in FIG. 2, a plurality of through holes 28 for allowing clampers 18 to pass through is formed on an outer periphery portion of heat sink 16 correspondingly to the plurality of through holes 20 on substrate 10 described above. As illustrated in FIGS. 2 and 4, by way that clampers 18 pass through each of through holes 28 on heat sink 16 and through holes 20 on substrate 10, heat sink 16 is fixed to front face 10a of substrate 10. Clampers 18 are formed so that heating component 12 and heat transfer member 14 laminated to each other can at this time be pinched between front face 10a of substrate 10 and back face 16a of heat sink 16. Heat sink 16 and substrate 10 are fixed by clampers 18 at least three locations, for example.

As illustrated in FIG. 4, heat emitted from heat spreader 26 is transmitted to heat sink 16 via heat transfer member 14, and then radiates through heat sink 16. A plurality of radiation fins may be formed on heat sink 16 in order to heighten heat radiation characteristics of heat sink 16.

[1-2. Configuration of Conductive Tape]

Heat radiation structure 2 according to the first exemplary embodiment further includes conductive tape 30. Conductive tape 30 is an example of the conductive member. Conductive tape 30 is a characteristic configuration of heat radiation structure 2 according to the first exemplary embodiment. The configuration of conductive tape 30 will be described hereinafter with reference to FIGS. 2 to 5B.

As illustrated in FIGS. 2 to 5B, conductive tape 30 is flexible tape for electrically connecting heat spreader 26 and heat sink 16. Conductive tape 30 is made of a metallic material such as aluminum or copper, and thus has conductivity. Conductive tape 30 has a thickness of 0.1 mm or smaller in the Z-axis direction, for example. Conductive tape 30 is provided with an adhesive layer on one side (or both sides).

As illustrated in FIGS. 4 and 5B, in the first exemplary embodiment, one end portion 30a of conductive tape 30 is pinched between heat spreader 26 and heat transfer member 14. Therefore, conductive tape 30 and heat spreader 26 are electrically connected to each other. As illustrated in FIG. 4, other end portion 30b of conductive tape 30 contacts an area on back face 16a of heat sink 16, at which heat transfer member 14 is not disposed. Therefore, conductive tape 30 and heat sink 16 are electrically connected to each other. As described above, conductive tape 30 is disposed so as to extend from between heat spreader 26 and heat transfer member 14 to back face 16a of heat sink 16. Heat spreader 26 and heat sink 16 are then electrically connected to each other via conductive tape 30.

One end portion 30a of conductive tape 30 is applied onto heat transfer member 14 through the adhesive layer. Other end portion 30b of conductive tape 30 is applied onto back face 16a of heat sink 16 through the adhesive layer. In a production process of heat radiation structure 2, placing heat transfer member 14 on back face 16a of heat sink 16 and then applying conductive tape 30, as described above, can simplify the production process.

[1-3. Effect and the Like]

As described above, in this exemplary embodiment, a heat radiation structure includes a heat spreader provided on a heating component mounted on a substrate, a heat sink disposed at a position facing the heat spreader, a heat transfer member disposed between the heat spreader and the heat sink, and transmitting heat from the heat spreader to the heat sink, and a conductive member electrically connecting the heat spreader and the heat sink.

In this exemplary embodiment, an electronic device includes a substrate, a heating component mounted on the substrate and including a heat spreader, a heat sink disposed at a position facing the heat spreader, a heat transfer member disposed between the heat spreader and the heat sink, and transmitting heat from the heat spreader to the heat sink, and a conductive member electrically connecting the heat spreader and the heat sink.

Electronic device 4 is an example of the electronic device. Heat radiation structure 2 is an example of the heat radiation structure. Substrate 10 is an example of the substrate. Heating component 12 is an example of the heating component. Heat spreader 26 is an example of the heat spreader. Heat sink 16 is an example of the heat sink. Heat transfer member 14 is an example of the heat transfer member. Conductive tape 30 is an example of the conductive member.

For example, in the example described in the first exemplary embodiment, heat radiation structure 2 includes heat spreader 26 provided on heating component 12 mounted on substrate 10, heat sink 16 disposed at a position facing heat spreader 26, heat transfer member 14 disposed between heat spreader 26 and heat sink 16, and transmitting heat from heat spreader 26 to heat sink 16, and conductive tape 30 electrically connecting heat spreader 26 and heat sink 16.

In the example described in the first exemplary embodiment, electronic device 4 includes substrate 10, heating component 12 mounted on substrate 10 and including heat spreader 26, heat sink 16 disposed at a position facing heat spreader 26, heat transfer member 14 disposed between heat spreader 26 and heat sink 16, and transmitting heat from heat spreader 26 to heat sink 16, and conductive tape 30 electrically connecting heat spreader 26 and heat sink 16.

In heat radiation structure 2 or electronic device 4 configured as described above, since heat spreader 26 and heat sink 16 are electrically connected to each other via conductive tape 30, a potential of heat spreader 26 and a potential of heat sink 16 are substantially identical to each other, and thus a capacitive coupling between heat spreader 26 and heat sink 16 can be weakened. As a result, electromagnetic waves to be radiated from heat sink 16 due to the capacitive coupling can be reduced, and thus a measure against EMI can sufficiently be implemented.

In the heat radiation structure, the heat spreader and the heating component may be integrally formed.

In the heat radiation structure, the conductive member may be a conductive tape contacting each of the heat spreader and the heat sink.

Conductive tape 30 is an example of the conductive tape.

For example, in the example described in the first exemplary embodiment, the conductive member is conductive tape 30 contacting each of heat spreader 26 and heat sink 16.

In heat radiation structure 2 configured as described above, for example, one end portion 30a of conductive tape 30 can be pinched between heat spreader 26 and heat transfer member 14. Therefore, an electrical connection between heat spreader 26 and heat sink 16 can easily be achieved by conductive tape 30.

In the heat radiation structure, one end portion of the conductive tape may be pinched between the heat spreader and the heat transfer member. The other end portion of the conductive tape may contact an area on a back face of the heat sink, at which the heat transfer member is not disposed.

One end portion 30a of conductive tape 30 is an example of the one end portion of the conductive tape. Other end portion 30b of conductive tape 30 is an example of the other end portion of the conductive tape. Back face 16a of heat sink 16 is an example of the back face of the heat sink.

For example, in the example described in the first exemplary embodiment, one end portion 30a of conductive tape 30 is pinched between heat spreader 26 and heat transfer member 14. Other end portion 30b of conductive tape 30 contacts an area on back face 16a of heat sink 16, at which heat transfer member 14 is not disposed.

In heat radiation structure 2 configured as described above, since conductive tape 30 is not pinched between heat sink 16 and heat transfer member 14, a contact area between heat sink 16 and heat transfer member 14 can thus be relatively increased. As a result, heat radiation characteristics of heat sink 16 can be heightened.

In the heat radiation structure, the heating component may be a semiconductor integrated circuit.

For example, in the example described in the first exemplary embodiment, heating component 12 is a semiconductor integrated circuit (LSI).

Heat radiation structure 2 configured as described above can effectively radiate heat emitted from the semiconductor integrated circuit (LSI) having a relatively greater heating value.

Second Exemplary Embodiment

Next, a second exemplary embodiment will be described hereinafter with reference to FIGS. 6 and 7.

[2-1. Configuration of Heat Radiation Structure]

A configuration of heat radiation structure 2A according to the second exemplary embodiment will be described hereinafter with reference to FIGS. 6 and 7. Heat radiation structure 2A described in the second exemplary embodiment can be mounted on electronic device 4, similarly to heat radiation structure 2 described in the first exemplary embodiment. Differences between heat radiation structure 2A and heat radiation structure 2 described in the first exemplary embodiment will mainly be described hereinafter.

Figure 6:
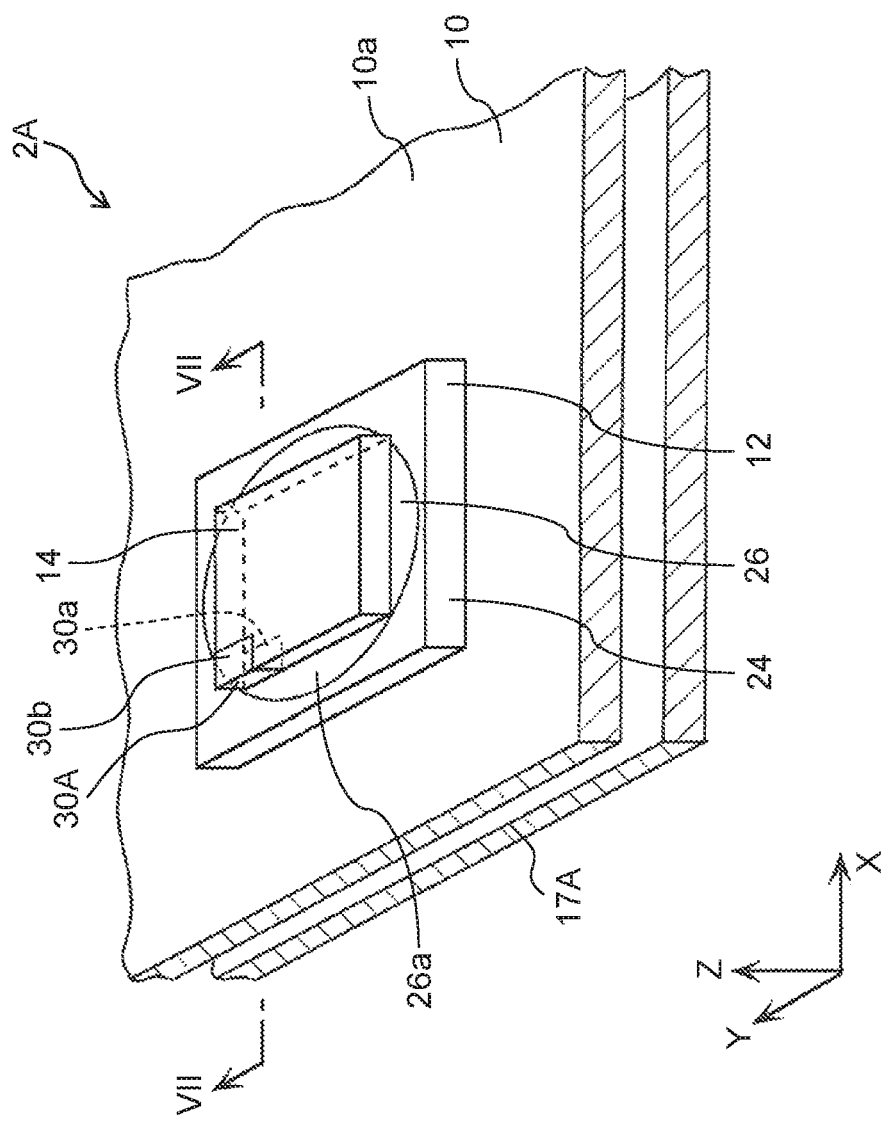
FIG. 6 is a perspective view schematically illustrating an example of a heat radiation structure according to a second exemplary embodiment.

FIG. 6 is a perspective view schematically illustrating an example of heat radiation structure 2A according to the second exemplary embodiment. The perspective view illustrated in FIG. 6 partially illustrates in an enlarged manner heat radiation structure 2A according to the second exemplary embodiment. In FIG. 6, some members including heat sink 16A are omitted for facilitating visual understanding.

Figure 7:
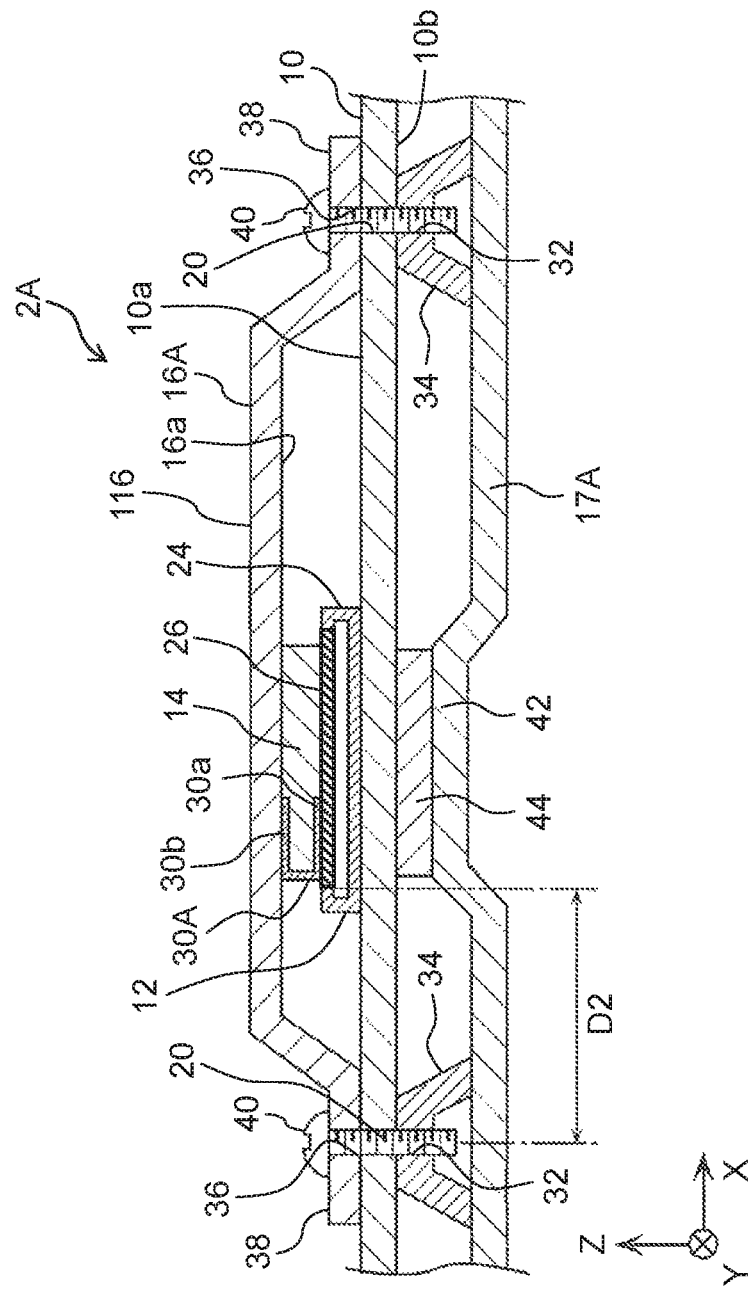
FIG. 7 is a cross-sectional view schematically illustrating the example of the heat radiation structure according to the second exemplary embodiment.

FIG. 7 is a cross-sectional view schematically illustrating the example of heat radiation structure 2A according to the second exemplary embodiment. FIG. 7 illustrates a cross-sectional view of heat radiation structure 2A illustrated in FIG. 6, which is taken along line VII-VII.

In the following description, components substantially identical to components included in heat radiation structure 2 described in the first exemplary embodiment are denoted by identical numerals or symbols, and their descriptions are omitted.

Heat radiation structure 2A includes conductive tape 30A having a characteristic and a structure substantially identical to a characteristic and a structure of conductive tape 30 described in the first exemplary embodiment. However, in heat radiation structure 2A according to the second exemplary embodiment, a disposition of conductive tape 30A differs from a disposition of conductive tape 30 described in the first exemplary embodiment.

Specifically, as illustrated in FIGS. 6 and 7, conductive tape 30A is bent in an approximately C shape, and disposed so as to laterally cover one end portion on a side of heat transfer member 14. In other words, one end portion 30a of conductive tape 30A is pinched between heat spreader 26 and heat transfer member 14. Other end portion 30b of conductive tape 30A is pinched between heat sink 16 and heat transfer member 14. Therefore, heat spreader 26 and heat sink 16 are electrically connected to each other via conductive tape 30A. Conductive tape 30A may be applied onto heat transfer member 14 through an adhesive layer.

Heat sink 16A is substantially identical to heat sink 16 described in the first exemplary embodiment, and chassis 17A is substantially identical to chassis 17 described in the first exemplary embodiment. However, each of their shapes differs.

As illustrated in FIG. 7, chassis 17A is provided with a plurality of supporting stands 34 each having screw hole 32. An outer periphery portion of heat sink 16A is provided with a plurality of flange portions 38 having a plurality of through holes 36.

Heat sink 16A includes, between flange portions 38, raised portion 116 that protrudes upward from substrate 10 and is away from front face 10a of substrate 10. Flange portions 38 of heat sink 16A are disposed on front face 10a of substrate 10. At this time, raised portion 116 is formed so that heating component 12 and heat transfer member 14 laminated to each other can be disposed in raised portion 116, and back face 16a of raised portion 116 contacts a front face of heat transfer member 14 on heating component 12.

By way that screws 40 are inserted into through holes 36 on heat sink 16A and through holes 20 on substrate 10, and are tightened to screw holes 32 on supporting stands 34, heat sink 16A is fixed to substrate 10, and substrate 10 is fixed to chassis 17A. At this time, inside raised portion 116, heat sink 16A pinches heating component 12 and heat transfer member 14 laminated to each other between front face 10a of substrate 10 and back face 16a of heat sink 16A. Therefore, back face 16a of heat sink 16A is closely fitted to the front face of heat transfer member 14 on heating component 12, as well as is closely fitted to other end portion 30b of conductive tape 30A. Therefore, heat sink 16A is electrically connected to conductive tape 30A, as well as is electrically connected to heat spreader 26 via conductive tape 30A.

Screws 40 are each made of a metallic material, and have conductivity. Heat radiation structure 2A is configured so as to electrically connect heat sink 16A and a ground potential wire of substrate 10 via screws 40. Therefore, each of potentials of heat sink 16A and heat spreader 26 is substantially identical to the ground potential, and thus a capacitive coupling between heat spreader 26 and heat sink 16A is weakened.

Screws 40 are disposed so that disposition gap D2 between each of screws 40 and heat spreader 26 (see FIG. 7) is smaller than a ¼ wavelength (e.g., approximately 15 cm) of a frequency of an electromagnetic wave to be radiated from heating component 12. Disposition gap D2 represents, as illustrated in FIG. 7, a distance between one end portion of heat spreader 26, which lies closest to one of screws 40, and an approximately center (a central axis) of the one of screws 40. Therefore, unnecessary electromagnetic waves (unnecessary energy in an electromagnetic field) to be radiated from heat sink 16A can be reduced.

As illustrated in FIG. 7, chassis 17A is further provided with projection portion 42 projecting toward substrate 10. Heat transfer member 44 is pinched between back face 10b of substrate 10, an area of which corresponds to heating component 12 (a face opposite to front face 10a), and projection portion 42. Heat transfer member 44 is a member for transmitting to chassis 17A heat that is emitted from package 24 of heating component 12 and that is transmitted to substrate 10, and is made of silicone rubber, for example. Heat transfer member 14 has, for example, a thickness of approximately several mm (e.g., in a range from 1 mm to 5 mm inclusive) in the Z-axis direction. Heat emitted from package 24 of heating component 12 is transmitted, via substrate 10 and heat transfer member 44, to chassis 17A, and radiates through chassis 17A. Therefore, heat radiation structure 2A can effectively radiate heat emitted from heating component 12.

[2-2. Effect and the Like]

As described above, in this exemplary embodiment, a heat radiation structure includes a heat spreader provided on a heating component mounted on a substrate, a heat sink disposed at a position facing the heat spreader, a heat transfer member disposed between the heat spreader and the heat sink, and transmitting heat from the heat spreader to the heat sink, and a conductive member electrically connecting the heat spreader and the heat sink.

In this exemplary embodiment, an electronic device includes a substrate, a heating component mounted on the substrate and including a heat spreader, a heat sink disposed at a position facing the heat spreader, a heat transfer member disposed between the heat spreader and the heat sink, and transmitting heat from the heat spreader to the heat sink, and a conductive member electrically connecting the heat spreader and the heat sink.

Electronic device 4 is an example of the electronic device. Heat radiation structure 2A is an example of the heat radiation structure. Substrate 10 is an example of the substrate. Heating component 12 is an example of the heating component. Heat spreader 26 is an example of the heat spreader. Heat sink 16A is an example of the heat sink. Heat transfer member 14 is an example of the heat transfer member. Conductive tape 30A is an example of the conductive member.

For example, in the example described in the second exemplary embodiment, heat radiation structure 2A includes heat spreader 26 provided on heating component 12 mounted on substrate 10, heat sink 16A disposed at a position facing heat spreader 26, heat transfer member 14 disposed between heat spreader 26 and heat sink 16A, and transmitting heat from heat spreader 26 to heat sink 16A, and conductive tape 30A electrically connecting heat spreader 26 and heat sink 16A.

In the example described in the second exemplary embodiment, electronic device 4 includes substrate 10, heating component 12 mounted on substrate 10 and including heat spreader 26, heat sink 16A disposed at a position facing heat spreader 26, heat transfer member 14 disposed between heat spreader 26 and heat sink 16A, and transmitting heat from heat spreader 26 to heat sink 16A, and conductive tape 30A electrically connecting heat spreader 26 and heat sink 16A.

In heat radiation structure 2A or electronic device 4 configured as described above, since heat spreader 26 and heat sink 16A are electrically connected to each other via conductive tape 30A, a potential of heat spreader 26 and a potential of heat sink 16A are substantially identical to each other, and thus a capacitive coupling between heat spreader 26 and heat sink 16A can be weakened. As a result, electromagnetic waves to be radiated from heat sink 16A due to the capacitive coupling can be reduced, and thus a measure against EMI can sufficiently be implemented.

In the heat radiation structure, the conductive member may be a conductive tape contacting each of the heat spreader and the heat sink. One end portion of the conductive tape may be pinched between the heat spreader and the heat transfer member. The other end portion of the conductive tape may be pinched between the heat sink and the heat transfer member.

Conductive tape 30A is an example of the conductive tape. One end portion 30a of conductive tape 30A is an example of the one end portion of the conductive tape. Other end portion 30b of conductive tape 30A is an example of the other end portion of the conductive tape.

For example, in the example described in the second exemplary embodiment, the conductive member is conductive tape 30A contacting each of heat spreader 26 and heat sink 16A. One end portion 30a of conductive tape 30A is pinched between heat spreader 26 and heat transfer member 14. Other end portion 30b of conductive tape 30A is pinched between heat sink 16A and heat transfer member 14.

In heat radiation structure 2A configured as described above, heat spreader 26 and heat sink 16A are electrically connected to each other via conductive tape 30A, and thus electromagnetic waves to be radiated from heat sink 16A can be reduced, similarly to the first exemplary embodiment. Since one end portion 30a of conductive tape 30A is pinched between heat spreader 26 and heat transfer member 14, and other end portion 30b is pinched between heat sink 16A and heat transfer member 14, the reliability of electrical connection between heat spreader 26 and heat sink 16A can be enhanced.

Third Exemplary Embodiment

Next, a third exemplary embodiment will be described hereinafter with reference to FIGS. 8 and 9.

[3-1. Configuration of Heat Radiation Structure]

A configuration of heat radiation structure 2B according to the third exemplary embodiment will be described hereinafter with reference to FIGS. 8 and 9. Heat radiation structure 2B described in the third exemplary embodiment can be mounted on electronic device 4, similarly to heat radiation structure 2 described in the first exemplary embodiment. Heat radiation structure 2B described in the third exemplary embodiment has a structure substantially identical to a structure of heat radiation structure 2A described in the second exemplary embodiment. Differences between heat radiation structure 2B and heat radiation structure 2A described in the second exemplary embodiment will mainly be described hereinafter.

Figure 8:
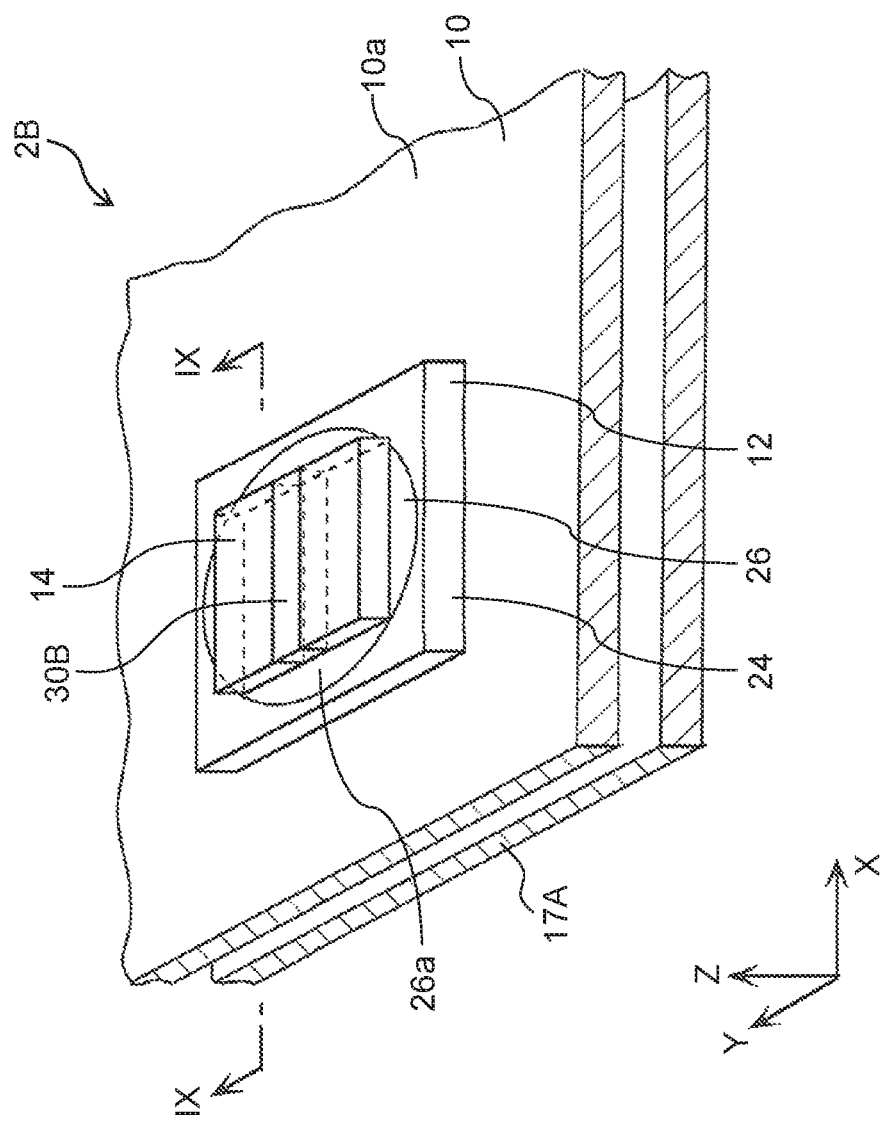
FIG. 8 is a perspective view schematically illustrating an example of a heat radiation structure according to a third exemplary embodiment.

FIG. 8 is a perspective view schematically illustrating an example of heat radiation structure 2B according to the third exemplary embodiment. The perspective view illustrated in FIG. 8 partially illustrates in an enlarged manner heat radiation structure 2B according to the third exemplary embodiment. In FIG. 8, some members including heat sink 16A are omitted for facilitating visual understanding.

Figure 9:
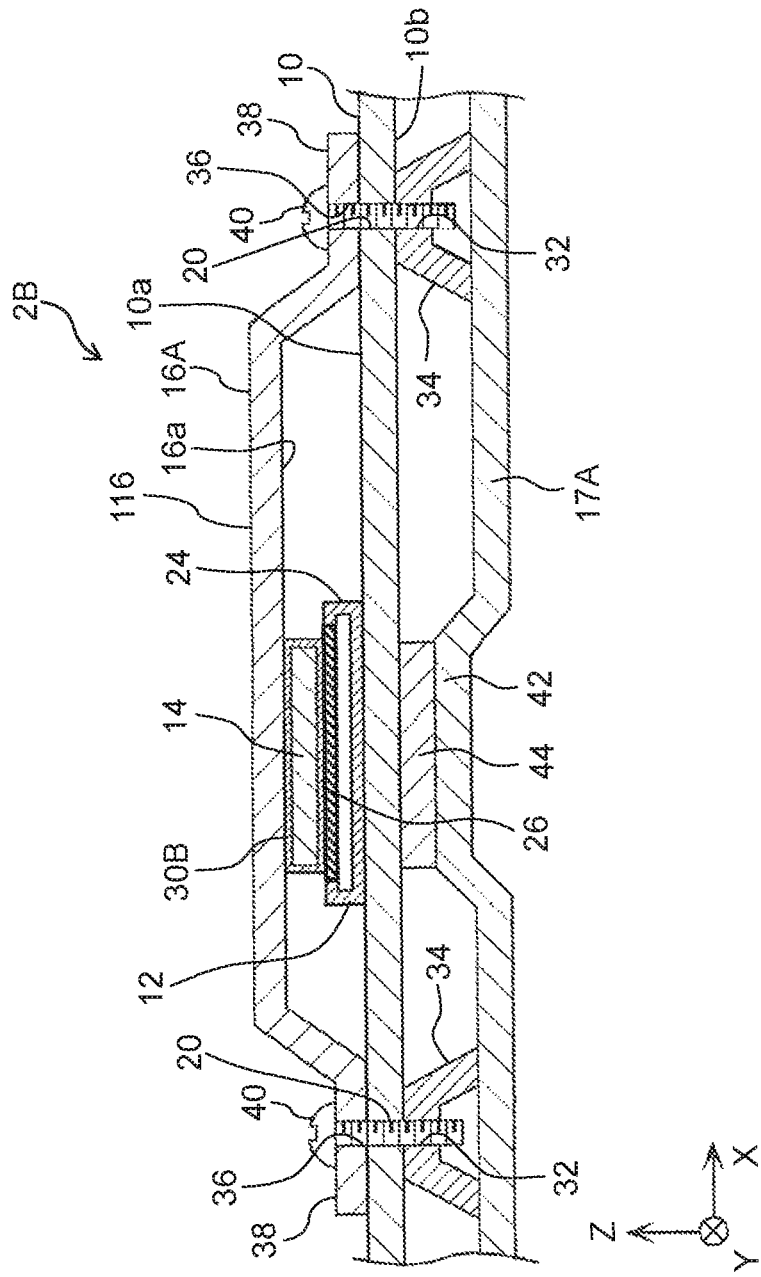
FIG. 9 is a cross-sectional view schematically illustrating the example of the heat radiation structure according to the third exemplary embodiment.

FIG. 9 is a cross-sectional view schematically illustrating the example of heat radiation structure 2B according to the third exemplary embodiment. FIG. 9 illustrates a cross-sectional view of heat radiation structure 2B illustrated in FIG. 8, which is taken along line IX-IX.

In the following description, components substantially identical to the components included in heat radiation structure 2 described in the first exemplary embodiment or in heat radiation structure 2A described in the second exemplary embodiment are denoted by identical numerals or symbols, and their descriptions are omitted.

As is apparent from comparisons between FIGS. 6 and 7 and FIGS. 8 and 9, heat radiation structure 2B has the structure substantially identical to the structure of heat radiation structure 2A described in the second exemplary embodiment. However, heat radiation structure 2B differs from heat radiation structure 2A described in the second exemplary embodiment, in that heat radiation structure 2B includes conductive tape 30B, instead of conductive tape 30A.

Conductive tape 30B has a characteristic and a structure substantially identical to the characteristics and the structures of conductive tape 30 described in the first exemplary embodiment and conductive tape 30A described in the second exemplary embodiment. However, in heat radiation structure 2B according to the third exemplary embodiment, a disposition of conductive tape 30B differs from the disposition of conductive tape 30A described in the second exemplary embodiment.

Specifically, as illustrated in FIGS. 8 and 9, conductive tape 30B is wrapped around heat transfer member 14 so as to pass between heat spreader 26 and heat transfer member 14 and between heat sink 16A and heat transfer member 14. Conductive tape 30B is pinched between heat spreader 26 and heat transfer member 14, as well as is pinched between heat sink 16A and heat transfer member 14. Therefore, heat spreader 26 and heat sink 16A are electrically connected to each other via conductive tape 30B. Therefore, potentials of heat sink 16A and heat spreader 26 are substantially identical to the ground potential, and thus a capacitive coupling between heat spreader 26 and heat sink 16A is weakened. Conductive tape 30B may be applied onto heat transfer member 14 through an adhesive layer.

[3-2. Effect and the Like]

As described above, in this exemplary embodiment, a heat radiation structure includes a heat spreader provided on a heating component mounted on a substrate, a heat sink disposed at a position facing the heat spreader, a heat transfer member disposed between the heat spreader and the heat sink, and transmitting heat from the heat spreader to the heat sink, and a conductive member electrically connecting the heat spreader and the heat sink.

In this exemplary embodiment, an electronic device includes a substrate, a heating component mounted on the substrate and including a heat spreader, a heat sink disposed at a position facing the heat spreader, a heat transfer member disposed between the heat spreader and the heat sink, and transmitting heat from the heat spreader to the heat sink, and a conductive member electrically connecting the heat spreader and the heat sink.

Electronic device 4 is an example of the electronic device. Heat radiation structure 2B is an example of the heat radiation structure. Substrate 10 is an example of the substrate. Heating component 12 is an example of the heating component. Heat spreader 26 is an example of the heat spreader. Heat sink 16A is an example of the heat sink. Heat transfer member 14 is an example of the heat transfer member. Conductive tape 30B is an example of the conductive member.

For example, in the example described in the third exemplary embodiment, heat radiation structure 2B includes heat spreader 26 provided on heating component 12 mounted on substrate 10, heat sink 16A disposed at a position facing heat spreader 26, heat transfer member 14 disposed between heat spreader 26 and heat sink 16A, and transmitting heat from heat spreader 26 to heat sink 16A, and conductive tape 30B electrically connecting heat spreader 26 and heat sink 16A.

In the example described in the third exemplary embodiment, electronic device 4 includes substrate 10, heating component 12 mounted on substrate 10 and including heat spreader 26, heat sink 16A disposed at a position facing heat spreader 26, heat transfer member 14 disposed between heat spreader 26 and heat sink 16A, and transmitting heat from heat spreader 26 to heat sink 16A, and conductive tape 30B electrically connecting heat spreader 26 and heat sink 16A.

In heat radiation structure 2B or electronic device 4 configured as described above, since heat spreader 26 and heat sink 16A are electrically connected to each other via conductive tape 30B, a potential of heat spreader 26 and a potential of heat sink 16A are substantially identical to each other, and thus a capacitive coupling between heat spreader 26 and heat sink 16A can be weakened. As a result, electromagnetic waves to be radiated from heat sink 16A due to the capacitive coupling can be reduced, and thus a measure against EMI can sufficiently be implemented.

In the heat radiation structure, the conductive member may be a conductive tape contacting each of the heat spreader and the heat sink. The conductive tape may be wrapped around the heat transfer member so as to pass between the heat spreader and the heat transfer member and between the heat sink and the heat transfer member.

Conductive tape 30B is an example of the conductive tape.

For example, in the example described in the third exemplary embodiment, the conductive member is conductive tape 30B contacting each of heat spreader 26 and heat sink 16A. Conductive tape 30B is wrapped around heat transfer member 14 so as to pass between heat spreader 26 and heat transfer member 14 and between heat sink 16A and heat transfer member 14.

In heat radiation structure 2A configured as described above, heat spreader 26 and heat sink 16A are electrically connected to each other via conductive tape 30B, and thus electromagnetic waves to be radiated from heat sink 16A can be reduced, similarly to the first exemplary embodiment. Since a part of conductive tape 30B is pinched between heat spreader 26 and heat transfer member 14, and another part of conductive tape 30B is pinched between heat sink 16A and heat transfer member 14, the reliability of electrical connection between heat spreader 26 and heat sink 16A can be enhanced.

Other Exemplary Embodiments

As described, the first to third exemplary embodiments have been described to exemplify a technique disclosed in the present application. However, the technique in the present disclosure is not limited to this, and can also be applied to an exemplary embodiment in which modification, replacement, addition, omission, or the like is performed. In addition, a new exemplary embodiment can be made by combining constituents described in the above first to third exemplary embodiments.

Therefore, other exemplary embodiments will be described hereinafter.

In the first to third exemplary embodiments, exemplary configurations where electronic device 4 is a liquid crystal television receiver have been described. However, electronic device 4 is not limited to a liquid crystal television receiver. Electronic device 4 may be another electronic device such as a Blu-ray (registered trademark) recorder, a personal computer, a tablet, or a smartphone.

In the first to third exemplary embodiments, the exemplary configurations where heating component 12 is an LSI have been described. However, heating component 12 is not limited to an LSI. Heating component 12 may be, for example, an IC or a microprocessor.

In the first to third exemplary embodiments, the exemplary configurations where conductive tape 30 (30A, 30B) is made of aluminum or copper have been described. However, a material of conductive tape 30 (30A, 30B) is not limited to such a material whatsoever. Conductive tape 30 (30A, 30B) may be made of, for example, laminated graphite.

In the first to third exemplary embodiments, the exemplary configurations where a conductive member is conductive tape 30 (30A, 30B) have been described. However, a conductive member is not limited to conductive tape 30 (30A, 30B). Conductive tape 30 (30A, 30B) is merely an example of a conductive member. A conductive member may be achieved by, for example, a lead wire having conductivity and flexibility.

As described above, the exemplary embodiments have been described to exemplify the technique disclosed in the present disclosure. For this reason, accompanying drawings and detail description are provided.

Therefore, the components described in the accompanying drawings and the detailed description may include not only the components essential for solving the problem but also components that are not essential for solving the problem in order to illustrate the techniques. For this reason, even if these unessential components are described in the accompanying drawings and the detailed description, these unessential components should not be immediately approved as being essential.

Further, since the above exemplary embodiments illustrate the technique in the present disclosure, various modifications, substitutions, additions and omissions can be performed within the scope of claims and equivalent scope of claims.

INDUSTRIAL APPLICABILITY

The present disclosure is applicable to a heat radiation structure for radiating heat emitted from a heating component. Specifically, the present disclosure is applicable to a heat radiation structure for radiating heat emitted from a semiconductor integrated circuit (e.g., LSI) mounted on a substrate included in an electronic device such as a liquid crystal television receiver.

REFERENCE MARKS IN THE DRAWINGS 2, 2A, 2B: heat radiation structure
4: electronic device
6: liquid crystal panel unit
8: housing
10: substrate
10a, 26a: front face
10b, 16a: back face
12: heating component
14, 44: heat transfer member
16, 16A: heat sink
17, 17A: chassis
18: clamper
20, 28, 36: through hole
22: on-board contact
22a, 30a: one end portion
22b, 30b: other end portion
24: package
26: heat spreader
30, 30A, 30B: conductive tape
32: screw hole
34: supporting stand
38: flange portion
40: screw
42: projection portion
116: raised portion

The invention claimed is:
1. A heat radiation structure comprising:
a heat spreader provided on a heating component mounted on a substrate;
a heat sink disposed at a position facing the heat spreader;
a heat transfer member disposed between the heat spreader and the heat sink, and transmitting heat from the heat spreader to the heat sink; and
a conductive member electrically connecting the heat spreader and the heat sink, wherein:
the conductive member is a conductive tape contacting each of the heat spreader and the heat sink,
one end portion of the conductive tape is pinched between the heat spreader and the heat transfer member, and
an other end portion of the conductive tape contacts an area on a back face of the heat sink, at which the heat transfer member is not disposed.
2. The heat radiation structure according to claim 1, wherein
the heat spreader and the heating component are integrally formed.
3. The heat radiation structure according to claim 1, wherein
the heating component is a semiconductor integrated circuit.
4. A heat radiation structure comprising:
a heat spreader provided on a heating component mounted on a substrate;
a heat sink disposed at a position facing the heat spreader;

a heat transfer member disposed between the heat spreader and the heat sink, and transmitting heat from the heat spreader to the heat sink; and a conductive member electrically connecting the heat spreader and the heat sink, wherein:

the conductive member is a conductive tape contacting each of the heat spreader and the heat sink, and the conductive tape is wrapped around the heat transfer member so as to pass between the heat spreader and the heat transfer member and between the heat sink and the heat transfer member.

5. The heat radiation structure according to claim 4, wherein the heat spreader and the heating component are integrally formed.

6. The heat radiation structure according to claim 4, wherein the heating component is a semiconductor integrated circuit.

7. An electronic device comprising:

a substrate;

a heating component mounted on the substrate, and including a heat spreader;

a heat sink disposed at a position facing the heat spreader;

a heat transfer member disposed between the heat spreader and the heat sink, and transmitting heat from the heat spreader to the heat sink; and a conductive member electrically connecting the heat spreader and the heat sink, wherein:

the conductive member is a conductive tape contacting each of the heat spreader and the heat sink, one end portion of the conductive tape is pinched between the heat spreader and the heat transfer member, and an other end portion of the conductive tape contacts an area on a back face of the heat sink, at which the heat transfer member is not disposed.

8. An electronic device comprising:

a substrate;

a heating component mounted on the substrate, and including a heat spreader;

a heat sink disposed at a position facing the heat spreader;

a heat transfer member disposed between the heat spreader and the heat sink, and transmitting heat from the heat spreader to the heat sink; and a conductive member electrically connecting the heat spreader and the heat sink, wherein:

the conductive member is a conductive tape contacting each of the heat spreader and the heat sink, and the conductive tape is wrapped around the heat transfer member so as to pass between the heat spreader and the heat transfer member and between the heat sink and the heat transfer member.

\* \* \* \* \*